United States Patent

Hedman, Jr.

[15] 3,663,388

[45] May 16, 1972

[54] GOLD REMOVAL PROCESS

[72] Inventor: Clarence L. Hedman, Jr., Campbell, Calif.

[73] Assignee: SCM Corporation, New York, N.Y.

[22] Filed: Oct. 28, 1970

[21] Appl. No.: 84,908

[52] U.S. Cl. ..........204/146, 204/143 R
[51] Int. Cl. ..........B01k 1/00, B23p 1/00
[58] Field of Search..........204/146, 143 R

[56] References Cited

UNITED STATES PATENTS

| | | | |
|---|---|---|---|
| 3,267,013 | 8/1966 | Mathias et al. | 204/146 |
| 2,735,810 | 2/1956 | Gagliano | 204/146 |
| 2,596,307 | 5/1952 | Stuffer | 204/146 |

*Primary Examiner*—T. Tung
*Assistant Examiner*—T. Tufariello
*Attorney*—Armand G. Guibert

[57] ABSTRACT

A process for removing gold from a gold-coated substrate is disclosed. The gold-coated substrate is submerged in an electrolytically conductive solution. An electrode is also placed in the solution in spaced relation with the gold coating. A potential difference is applied across the electrode and the gold coating to render the coating positive with respect to the electrode thereby causing the gold coating to be oxidized. The applied potential difference is terminated and the substrate emerged from the solution. Oxidized gold remaining on the surface of the substrate is them removed.

10 Claims, No Drawings

GOLD REMOVAL PROCESS

BACKGROUND OF THE INVENTION

This invention relates generally to gold removal processes, and particularly to processes for stripping and etching gold from gold-coated substrates.

Heretofore, the stripping of gold coatings has ordinarily been accomplished through the use of gold solvents such as Aqua Regia and cyanides. Typically, the gold-coated substrate to be stripped is submerged briefly in the solvent, emerged and immediately rinsed. The length of time the substrate is submerged is dependent upon the thickness of the gold coating. Though this process appears simple there are several significant problems associated with its use. First, both Aqua Regia and cyanide solutions are extremely dangerous to handle. In addition to gold these solvents also react quickly and forcefully with many other metals. Thus, where the substrate is metallic such solvents can easily damage the substrate as it removes the gold coating, particularly where the coating of gold is of uneven thickness. This adverse action is even more pronounced where Aqua Regia is used upon an organic substrate such as plastic. By and large only ceramic substrates such as alumina and silica and glass are exempt from reaction. Consequently, the duration of the submerged step must be precisely determined and consistently repeated.

Similarily, where a particular pattern is to be etched in a gold coating, such as in forming printed circuit boards or using such techniques, the coating is masked and then sprayed or submerged into a solvent such as Aqua Regia or cyanide. Again it takes experimentation to determine the proper timing which timing cycle must be repeated with a high degree of accuracy to protect the substrate and to achieve proper line width. The danger accompanying the use of such highly dangerous solvents, of course, remains.

Accordingly, it is an object of the present invention to provide an improved gold removal process.

More particularly, it is an object of the present invention to provide a process for removing gold from gold-coated substrates without the use of dangerous solvents such as Aqua Regia and those including cyanides.

Another object of the invention is to provide a process for removing gold from gold-coated organic and glass substrates without the use of chemical agents which react speedily with such substrates.

Yet another object of the invention is to provide a process for stripping and etching gold from gold-coated substrates with a high degree of process control.

SUMMARY OF THE INVENTION

Briefly described, the present invention is a process for removing gold from a gold coating on a substrate. The gold-coated substrate is submerged in an electrolytically-conductive solution. An electrode is also placed in the solution in spaced relation with the gold coating. A potential difference is applied across the electrode and the gold coating to render the coating positive with respect to the electrode thereby causing the gold coating to be oxidized. The applied potential difference is terminated and the substrate emerged from the solution. Oxidized gold remaining on the surface of the substrate is then removed.

EXAMPLE 1

A sheet of metal such as copper, silver or brass having a coating of gold thereon which one desires to strip is electrically connected through an open switch to the positive terminal of a low voltage power supply. Another electrode is electrically coupled to the negative supply terminal. For most applications the parameters of the gold-coated metallic sheet are such as to require a power supply no greater than 20 VDC. The gold-coated sheet is then submerged into a beaker containing the stripping solution which solution preferably comprises a 1 M aqueous solution of an ammonium salt such as ammonium chloride and a 0.1 M solution of hydrochloric acid. The electrode coupled to the negative terminal of the power supply is also placed in the solution spaced from the gold-coated sheet of metal. The open switch is then closed. As the gold oxidizes it will blacken which action can, of course, be closely controlled by varying the potential difference between the gold coating and spaced electrode through the use of a potentiometer. The switch is then opened and the beaker placed in an ultrasonic tank which vibrates the oxidized gold particles off the metal sheet. The stripped metallic sheet is then emerged from the stripping solution and rinsed.

Other salts may be substituted for the ammonium chloride and other acids, such as nitric acid, substituted for the hydrochloric acid. The inclusion of ammonium chloride salt into water renders an electrolytically conductive solution; the optional inclusion of acid helps prevent formation of hydroxide precipitates. Where the solution is strongly acidic the oxidized gold particles may comprise gold oxide, some of which will be dissolved by the acid. If the solution is not acidic the gold will be oxidized to form another particle such as gold chloride which will not be dissolved.

EXAMPLE 2

The process may also be used on a sheet of ceramic such as alumina or beryllia having a coating of gold thereon to form a printed circuit board through etching of selected patterns in the gold coating. Here the gold is coated with a photoresist material which is then selectively exposed to light, developed and rinsed leaving the desired masking pattern of resist on the surface of the gold. The residual resist is electrically non-conductive and relatively inert in oxidizing mediums. For less precise etching plating tape, such as that sold under the registered trademark Scotch Brand could be used in lieu of photoresist.

Next an electrical lead is attached to the gold coating and the masked, gold-coated sheet submerged into the etching solution which may be the same as the stripping solution described in Example 1. An electrode is also disposed in the solution spaced from the masked coating. The electrode and electrical lead attached to the gold coating are then coupled to a 1 VDC battery with the electrode coupled to the negative battery terminal and the electrical lead coupled to the positive battery terminal. As the unmasked gold is oxidized it will blacken. At this point effervesce activity will become apparent along the blackened, unmasked portions of the gold coating indicating that oxidization is substantially complete in those areas. The etched sheet is then emerged from the etching solution, disconnected from the battery and sprayed with a liquid. As the oxidized gold adheres poorly to the substrate relative to the adherance of the masked gold the oxidized gold will be swept away. Alternatively, the oxidized gold may be removed by wiping with a soft cloth.

It should be understood that the just-described examples merely illustrate principles of the invention. Many modifications may, of course, be made thereto in addition to those expressly mentioned without departure from the spirit and scope of the invention as set forth in the concluding claims. For example, many substitute compositions may be used in lieu of those specifically identified. The particular, optimized potential difference utilized will depend on the parameters of the body to be stripped, etched or the like. In addition, the sequential order of the steps need not, of course, be strictly followed.

I claim:

1. A process for removing gold from a gold coating on a substrate comprising the steps of:

a. submerging said gold-coated substrate in an electrolytically conductive solution;

b. placing an electrode in said solution in spaced relation with said gold coating;

c. applying a potential difference across said electrode and said gold coating to render said coating positive with respect to said electrode thereby causing said gold coating to be oxidized;

d. terminating said applied potential difference;

e. emerging said substrate from said solution; and f. removing said oxidized gold from said substrate.

2. The process of claim 1 wherein said electrically conductive solution is acidic and comprises hydrochloric acid.

3. The process of claim 1 wherein said electrically conductive solution is acidic and comprises nitric acid.

4. The process of claim 1 wherein said electrically conductive solution comprises an ammonium salt.

5. The process of claim 4 wherein said electrically conductive solution is acidic.

6. The process of claim 4 wherein said electrically conductive solution comprises ammonium chloride.

7. The process of claim 1 wherein said electrically conductive solution is aqueous.

8. The process of claim 1 wherein a potential difference in the range of 1 to 20 volts direct current is applied across said gold coating and said electrode.

9. The process of claim 1 wherein selected portions of said gold coating are masked prior to step (a).

10. The process of claim 1 wherein step (f) said substrate is ultrasonically agitated.

* * * * *